(12) United States Patent
Kosemura et al.

(10) Patent No.: US 7,239,851 B2
(45) Date of Patent: Jul. 3, 2007

(54) HIGH FREQUENCY MODULE

(75) Inventors: Takahiko Kosemura, Kanagawa (JP); Akihiko Okubora, Kanagawa (JP)

(73) Assignee: Sony Corporation, Tokyo (JP)

( * ) Notice: Subject to any disclaimer, the term of this patent is extended or adjusted under 35 U.S.C. 154(b) by 334 days.

(21) Appl. No.: 10/475,940

(22) PCT Filed: Mar. 5, 2003

(86) PCT No.: PCT/JP03/02584

§ 371 (c)(1), (2), (4) Date: Oct. 27, 2003

(87) PCT Pub. No.: WO03/075393

PCT Pub. Date: Sep. 12, 2003

(65) Prior Publication Data

US 2004/0155734 A1 Aug. 12, 2004

(30) Foreign Application Priority Data

Mar. 7, 2002 (JP) ............................. 2002-062550

(51) Int. Cl.
*H04B 1/44* (2006.01)

(52) U.S. Cl. .................... 455/78; 455/80; 455/552.1; 333/103; 257/728

(58) Field of Classification Search ............. 455/550.1, 455/552.1, 553.1, 73, 78–83; 333/100–104, 333/134, 175; 257/728, 760, 664, 347; 343/700 MS, 343/701–702, 700 R; 370/275, 278
See application file for complete search history.

(56) References Cited

U.S. PATENT DOCUMENTS 5,699,023 A * 12/1997 Tanaka et al. .............. 333/103
6,060,960 A * 5/2000 Tanaka et al. .............. 333/104
6,366,564 B1 * 4/2002 Hiraka et al. ............... 370/275
6,476,695 B1 * 11/2002 Nakamichi .................. 333/246
6,633,748 B1 * 10/2003 Watanabe et al. ............ 455/78
6,766,149 B1 * 7/2004 Hikita et al. ................. 455/83
6,788,958 B2 * 9/2004 Furutani et al. .......... 455/552.1

(Continued)

FOREIGN PATENT DOCUMENTS

JP          05-023554 A         2/1993

(Continued)

*Primary Examiner*—Matthew D. Anderson
*Assistant Examiner*—Tuan Tran
(74) *Attorney, Agent, or Firm*—Robert J. Depke; Rockey, Depke, Lyons & Kitzinger LLC.

(57) ABSTRACT

The present invention provides a high frequency module having a base substrate unit (2) which has its uppermost layer planarized to form a buildup-forming surface (16), a high frequency circuit unit (3) having multiple wiring layers which are formed on the base substrate unit (2), each of which layers has a wiring pattern and film elements formed on a dielectric insulating layer thereof, whose uppermost wiring layer (17) has plural lands (22) and ground patterns (20) formed thereon together with the wiring pattern and inductor elements (19), and a semiconductor chip (4) mounted on the wiring layer (17) of the high frequency circuit unit (3). Transmission lines (24) to connect the inductor elements (19) and lands (22) which are formed on the wiring layer (17) are directed within hollowed pattern regions (20c) formed at the ground pattern (20) to constitute coplanar type transmission lines.

4 Claims, 5 Drawing Sheets

U.S. PATENT DOCUMENTS

| | | | |
|---|---|---|---|
| 6,987,984 B1 * | 1/2006 | Kemmochi et al. | 455/552.1 |
| 7,130,655 B2 * | 10/2006 | Kemmochi et al. | 455/552.1 |

FOREIGN PATENT DOCUMENTS

| JP | HEI 05 - 023554 | 2/1993 |
| --- | --- | --- |
| JP | 5-275862 A | 10/1993 |
| JP | 06-252612 A | 9/1994 |
| JP | HEI 06 - 252612 | 9/1994 |
| JP | 08-181458 A | 7/1996 |
| JP | HEI 08 - 181458 | 7/1996 |
| JP | 09-238005 A | 9/1997 |
| JP | HEI 09 - 238005 | 9/1997 |
| JP | 11-354717 A | 12/1999 |
| JP | HEI 11 - 354717 | 12/1999 |
| JP | 2000 - 286628 | 10/2000 |
| JP | 2000-286628 A | 10/2000 |
| JP | 2001 - 068852 | 3/2001 |
| JP | 2001-68852 A | 3/2001 |
| JP | 2001-068852 A | 3/2001 |
| JP | 2001 - 077240 | 3/2001 |
| JP | 2001-077240 A | 3/2001 |
| JP | 2001-177013 | 6/2001 |
| JP | 2002 - 033562 | 1/2002 |
| JP | 2002-033562 A | 1/2002 |
| JP | 2002 - 033582 | 1/2002 |
| JP | 2002-033582 A | 1/2002 |

\* cited by examiner

HIGH FREQUENCY MODULE

TECHNICAL FIELD

The present invention relates to a high frequency module which is effectively used in a radio communication module having radio communication function, storage function, etc.

This application claims priority of Japanese Patent Application No. 2002-062550, filed on Mar. 7, 2002 in Japan, the entirety of which is incorporated by reference herein.

BACKGROUND ART

Recently, in the field of communication systems for transmitting various information, owing to development of various communication terminal equipments and data processing systems as well as improvement of service networks of the ISDN (Integrated Service Digital Network), digital broadcasting, etc., transmission and reception of information using portable type equipments replacing fixed type equipments are widely coming into use. There is installed a radio communication module having radio communication function, storage function, etc. in a communication apparatus. Such a radio communication module includes an antenna unit for transmitting and receiving information signals which has an antenna and a changing-over switch, a transmission/reception switching-over unit for switching operational function between transmission and reception, a reception circuit unit having a frequency conversion circuit, a demodulation circuit, etc., a transmission circuit unit having a power amplifier, a drive amplifier, a modulation circuit, etc., and a reference frequency generation circuit unit for providing the reception circuit unit and the transmission circuit unit with reference frequency.

The radio communication module is coming to have higher functions or multiple functions, enabling high-speed communication of various information such as data information, image information, etc., while being required to be reduced in size as well as to have low electric power consumption property so as to be installed in a portable type communication apparatus. Conventionally, the radio communication module is configured using a circuit manufactured under the lumped-constant design, in which a substrate has formed thereon various filters and couplers as well as mounted thereon chip parts such as capacitors and coils. On the other hand, the radio communication module employing the lumped-constant design cannot fulfill above-described demand specification. Thus, generally, the radio communication module is configured using a circuit manufactured under the distributed parameter design, in which a wiring substrate has formed thereon passive elements such as inductors, capacitors, etc. in the film forming manner, and the respective passive elements and mount components are connected through transmission lines such as microstrip lines and strip lines.

Figure 1:
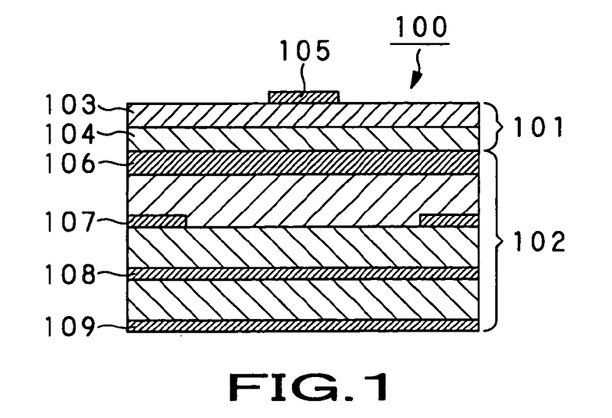
FIG. 1 shows a longitudinal sectional view of major part of a high frequency module having a microstrip type transmission line.

FIG. 1 shows the configuration of a conventional high frequency module substrate 100 in which a two-layer high frequency circuit unit 101 is formed in the buildup manner on a four-layer base substrate unit 102 which is formed by the general multilayer print wiring technology. In the high frequency module substrate 100, a first wiring layer 103 and a second wiring layer 104 are formed on a dielectric insulating layer respectively in the pattern forming manner to form the high frequency circuit unit 101, and passive elements such as inductors and capacitors are formed in the first and second wiring layers 103, 104 in the film forming manner by employing the thin-film technology or the thick-film technology, details of which will be omitted. The first wiring layer 103 has formed thereon in the pattern forming manner a transmission line 105 to connect the respective passive elements and lands which is formed under the distributed parameter design.

The high frequency module substrate 100 has power circuits and control circuits formed in respective wiring layers 106, 107, 108, and 109 of the base substrate unit 102 thereof, and the third wiring layer 106 is a fully solid ground layer whose whole surface is formed into ground, details of which will be omitted. In the high frequency module substrate 100, the high frequency circuit unit 101 and the base substrate unit 102 are electrically separated with the ground layer 106 arranged therebetween, which can suppress mutual electrical interference to realize property improvement. In the high frequency module substrate 100, since the ground layer 106 is defined as a ground surface, the transmission line 105 works as a microstrip line.

Figure 2:
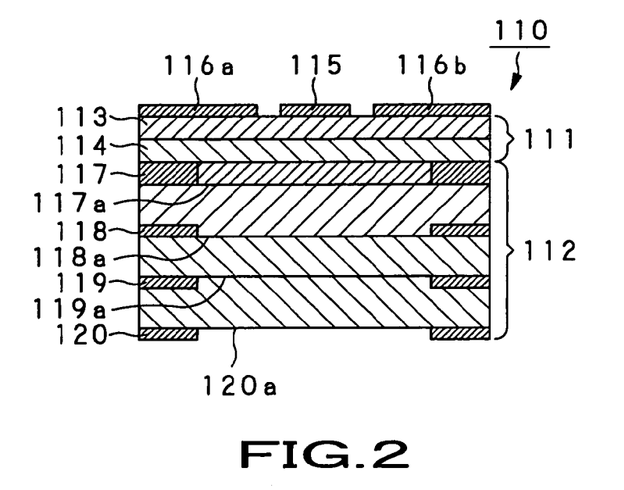
FIG. 2 shows a longitudinal sectional view of major part of a high frequency module having a coplanar type transmission line.

FIG. 2 shows the configuration of a high frequency module substrate 110 in which a two-layer high frequency circuit unit 111 is formed in the buildup manner on a four-layer base substrate unit 112 which is formed by the general multilayer print wiring technology, in which basic configuration of the high frequency circuit unit 111 and the base substrate unit 112 is similar to that in the high frequency module substrate 100. In the high frequency module substrate 110, a first wiring layer 113 of the high frequency circuit unit 111 has formed thereon in the pattern forming manner a transmission line 115 which is formed under the distributed parameter design, and has formed thereon ground patterns 116a and 116b being kept insulated from the transmission line 115.

The high frequency module substrate 110 shown in FIG. 2 has hollowed patterns 117a, 118a, 119a, and 120a formed at parts of respective wiring layers 117, 118, 119, and 120 of the base substrate unit 112 thereof facing the transmission line 115, which configuration defines no ground surface for the transmission line 115. In the high frequency module substrate 110, employing this configuration, the transmission line 115 works as a coplanar line. In the high frequency module substrate 110, the hollowed patterns 117a, 118a, 119a, and 120a are formed at all the respective wiring layers 117, 118, 119, and 120 of the base substrate unit 112. On the other hand, as a configuration not losing coplanar function of the transmission line 115, the fifth wiring layer 119 may be a fully solid ground layer.

Figure 3:
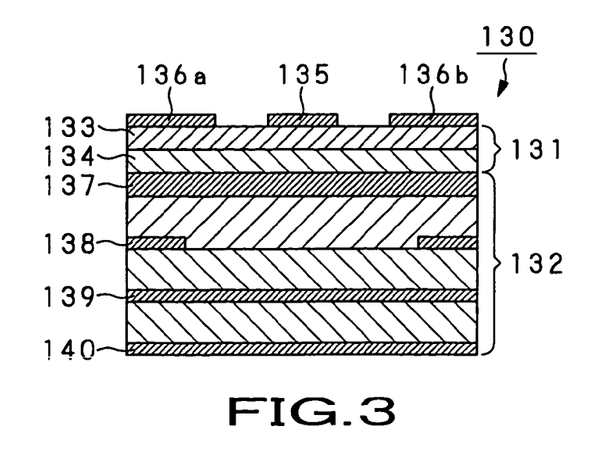
FIG. 3 shows a longitudinal sectional view of major part of a high frequency module having a ground coplanar type transmission line.

FIG. 3 shows the configuration of a high frequency module substrate 130 in which a high frequency circuit unit 131 having two wiring layers 133 and 134 is formed in the buildup manner on a base substrate unit 132 having four wiring layers 137, 138, 139, and 140 which is formed by the general multilayer print wiring technology, in which basic configuration of the high frequency circuit unit 131 and the base substrate unit 132 is similar to that in the high frequency module substrate 110. In the high frequency module substrate 130, the first wiring layer 133 of the high frequency circuit unit 131 has formed thereon in the pattern forming manner a transmission line 135 which is formed under the distributed parameter design, and has formed thereon ground patterns 136a and 136b being kept insulated from the transmission line 135.

In the high frequency module substrate 130 shown in FIG. 3, the third wiring layer 137 of the base substrate unit 132 is a fully solid ground layer. In the high frequency module substrate 130, the high frequency circuit unit 131 and the base substrate unit 132 are electrically separated with the ground layer 137 arranged therebetween, which can suppress mutual electrical interference to realize property improvement. In the high frequency module substrate 130, since the ground layer 137 is defined as a ground surface, the transmission line 135 works as a ground coplanar line.

Figure 4:
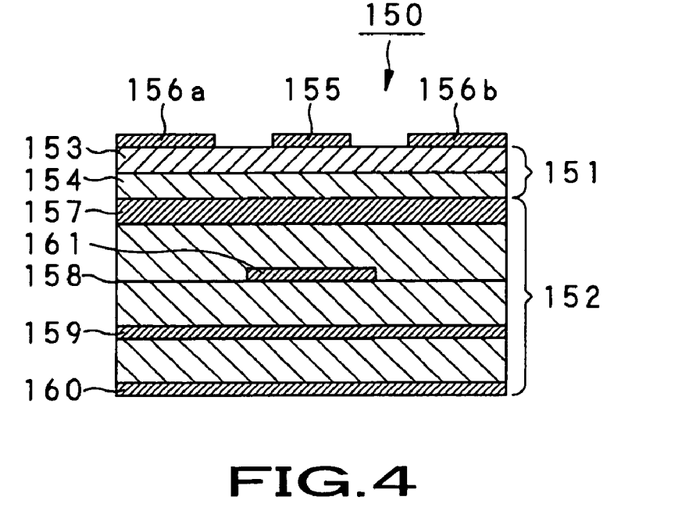
FIG. 4 shows a longitudinal sectional view of major part of a high frequency module having a strip type transmission line.

FIG. 4 shows the configuration of a high frequency module substrate 150 in which a high frequency circuit unit 151 having two wiring layers 153 and 154 is formed in the buildup manner on a base substrate unit 152 having four wiring layers 157, 158, 159, and 160 which is formed by the general multilayer print wiring technology, in which basic configuration of the high frequency circuit unit 151 and the base substrate unit 152 is similar to that in the high frequency module substrate 110. In the high frequency module substrate 150, the first wiring layer 153 of the high frequency circuit unit 151 has formed thereon in the pattern forming manner a transmission line 155 which is formed under the distributed parameter design, and has formed thereon ground patterns 156a and 156b being kept insulated from the transmission line 155.

In the high frequency module substrate 150 shown in FIG. 4, the third wiring layer 157 of the base substrate unit 152 is a fully solid ground layer. In the high frequency module substrate 150, the high frequency circuit unit 151 and the base substrate unit 152 are electrically separated with the ground layer 157 arranged therebetween, which can suppress mutual electrical interference to realize property improvement. In the high frequency module substrate 150, since the ground layer 157 is defined as a ground surface, the transmission line 155 works as a ground coplanar line.

In the high frequency module substrate 150 shown in FIG. 4, the fourth wiring layer 158 of the base substrate unit 152 has formed thereon in the pattern forming manner a transmission line 161 which is formed under the distributed parameter design, and the fifth wiring layer 159 facing the ground layer 157 with the transmission line 161 arranged therebetween is also a fully solid ground layer. Thus, the high frequency module substrate 150 has the transmission line 161 working as a strip line formed at an inner layer of the base substrate unit 152 thereof together with the transmission line 155 working as a ground coplanar line of the high frequency circuit unit 151.

On the other hand, in the conventional high frequency module, a ground pattern formed on a layer of multiple wiring substrates of, especially, a high frequency signal processing unit alone of a high frequency circuit block is defined as a ground surface to form a microstrip type transmission line, which can improve cost merit as well as effectively utilize substrate area. Since a semiconductor chip and electronic parts are mounted on the surface of a high frequency module, for example, a high frequency module substrate 200 shown in FIG. 5 is arranged.

Figure 5:
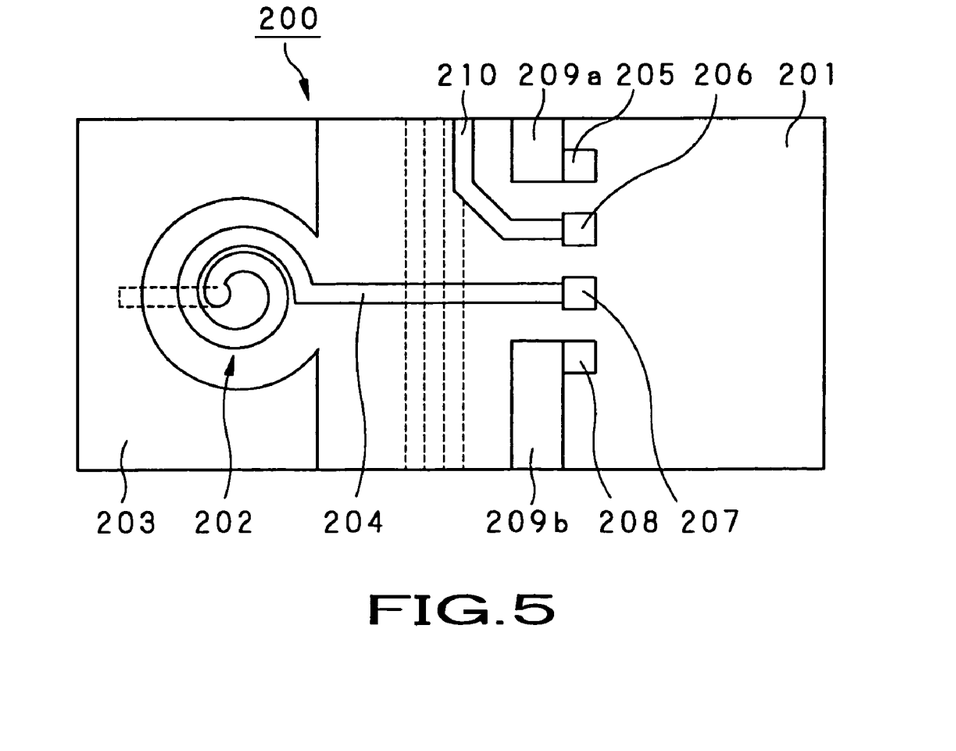
FIG. 5 shows a plan view of major part of a conventional high frequency module.

FIG. 5 shows the configuration of a high frequency module substrate 200 in which a high frequency circuit unit is formed in the buildup manner on a base substrate unit which is formed by the general multilayer print wiring technology, details of which will be omitted. In the high frequency module substrate 200, a surface layer 201 of the high frequency circuit unit shown in FIG. 5 has formed thereon a spiral type inductor element 202 in the film forming manner and a ground pattern 203 enclosing the inductor element 202. The inductor element 202 has its one end connected to a transmission line 204, and has its other end connected to an inner layer circuit of the high frequency circuit unit through via holes, details of which will be omitted.

In the high frequency module substrate 200, the surface layer 201 has formed thereon plural lands 205, 206, 207, and 208 onto which a semiconductor chip, not shown, is to be mounted under the flip chip mounting, as shown in FIG. 5. The first land 205 and the fourth land 208 are lands for ground which are unitedly formed together with ground patterns 209a and 209b respectively, and are connected to a ground pattern formed on a buildup-forming surface of the base substrate unit side through via holes, details of which will be omitted. The second land 206 is a land for DC signals. The third land 207 is a land for RF signals to which one end of the transmission line 204, whose other end is connected to the inductor element 202, is connected. The transmission line 204 is a microstrip type transmission line which defines the ground pattern formed at the base substrate unit side as a ground surface.

In the high frequency module substrate 200, the surface layer 201 has properly formed thereon plural lands, transmission lines, and passive elements such as capacitor elements, register elements, etc. In the high frequency module substrate 200, an antenna element, a coupler pattern, etc. are also formed in the film forming manner, and surface-mount type electronic parts which do not require ground connection are also properly mounted.

In the high frequency module substrate 200 shown in FIG. 5, since a ground pattern is formed on a buildup-forming surface of the base substrate unit side, it becomes possible to form transmission lines for digital signals, etc. in an inner layer, which can realize high density mounting. On the other hand, in the high frequency module substrate 200, a transmission line 210 for DC signals is formed on the surface layer 201, being directed to form a shortest distance from the second land 206. Thus, in the high frequency module substrate 200, the ground patterns 209a, 209b of the lands 205, 208 are separated from the ground pattern 203 of the inductor element 202, in which configuration continuity thereof cannot be maintained. In the high frequency module substrate 200, as has been described above, since the ground patterns 209a, 209b are connected to the ground pattern at the base substrate unit side through via holes, there is raised a problem that resistance components and inductance components of the via affects high frequency property. Furthermore, in the high frequency module substrate 200, since the respective passive elements generates capacitor components between the passive elements and the ground pattern of the base substrate unit side, there is raised a problem that self resonance frequency and Q value of quality factor are reduced, which undesirably deteriorates property.

In the high frequency module substrate 200, since a ground pattern defining a ground surface is formed at the base substrate unit side, and the transmission line 204 is configured as a microstrip type transmission line, thickness of respective layers of the base substrate unit side becomes unequal. Thus, in the high frequency module substrate 200, it is difficult to form a high frequency circuit unit onto the base substrate unit in the buildup manner with high accuracy, which undesirably deteriorates high frequency property.

DISCLOSURE OF THE INVENTION

Accordingly, the present invention has an object to overcome the above-mentioned drawbacks of the conventional high frequency module by providing a new high frequency module.

The present invention has an object to provide a high frequency module in which a coplanar type transmission line which is not required to define a ground surface at the base substrate unit side is formed at the uppermost wiring layer so as to improve high frequency property without managing thickness of respective insulating layers with high accuracy.

The above object can be attained by providing a high frequency module, including a base substrate unit having multilayered printed wiring boards which has its uppermost layer planarized to form a buildup-forming surface, a high frequency circuit unit having multiple wiring layers which are formed on the buildup-forming surface of the base substrate unit in the lamination manner, each of which layers has a wiring pattern and film elements formed on a dielectric insulating layer thereof, and mount components consisting of a semiconductor chip and electronic parts mounted on the uppermost wiring layer of the high frequency circuit unit.

The uppermost wiring layer of the high frequency circuit unit has plural lands and ground patterns formed thereon together with the wiring pattern and film elements, and the mount components are mounted onto the high frequency circuit unit by connecting terminals and ground terminals to the lands and ground patterns respectively formed on the uppermost wiring layer thereof. Transmission lines to connect the film elements and lands which are formed on the uppermost wiring layer of the high frequency circuit unit are insulated and directed within hollowed pattern regions formed at the ground pattern to constitute coplanar type transmission lines which are enclosed by a ground pattern at one common plane and are required to define no ground surface at lower layers.

According to the high frequency module of the present invention, since the high frequency circuit unit are formed on the planarized buildup-forming surface of the base substrate unit having comparatively inexpensive multilayered printed wiring boards in the lamination manner, manufacture cost can be reduced and film elements and a wiring pattern of high accuracy can be formed on each of the wiring layers of the high frequency circuit unit.

Furthermore, according to the high frequency module of the present invention, since coplanar type transmission lines which are required to define no ground surface at the base substrate unit side are formed on the uppermost wiring layer of the high frequency circuit unit, inequality in thickness of the insulating layers of the respective wiring layers can be reduced as well as severance of ground patterns formed on the uppermost wiring layer can be prevented, which can retain high frequency connectivity and continuity between the film elements and terminals, and can improve high frequency property.

These objects and other objects, features and advantages of the present invention will become more apparent from the following detailed description of the preferred embodiments of the present invention.

BEST MODE FOR CARRYING OUT THE INVENTION

The present invention will further be described below concerning the best modes with reference to the accompanying drawings.

The high frequency module of the present invention has information communication function, storage function, etc., and is used in a microminiaturized communication function module unit which is installed in or attached/detached as an option to/from various electronic apparatuses such as a personal computer, a cellular phone, a portable information terminal equipment, or a portable audio apparatus which are adapted to the small-scale radio communication system specification with carrier frequency band of 5 GHz.

Figure 6:
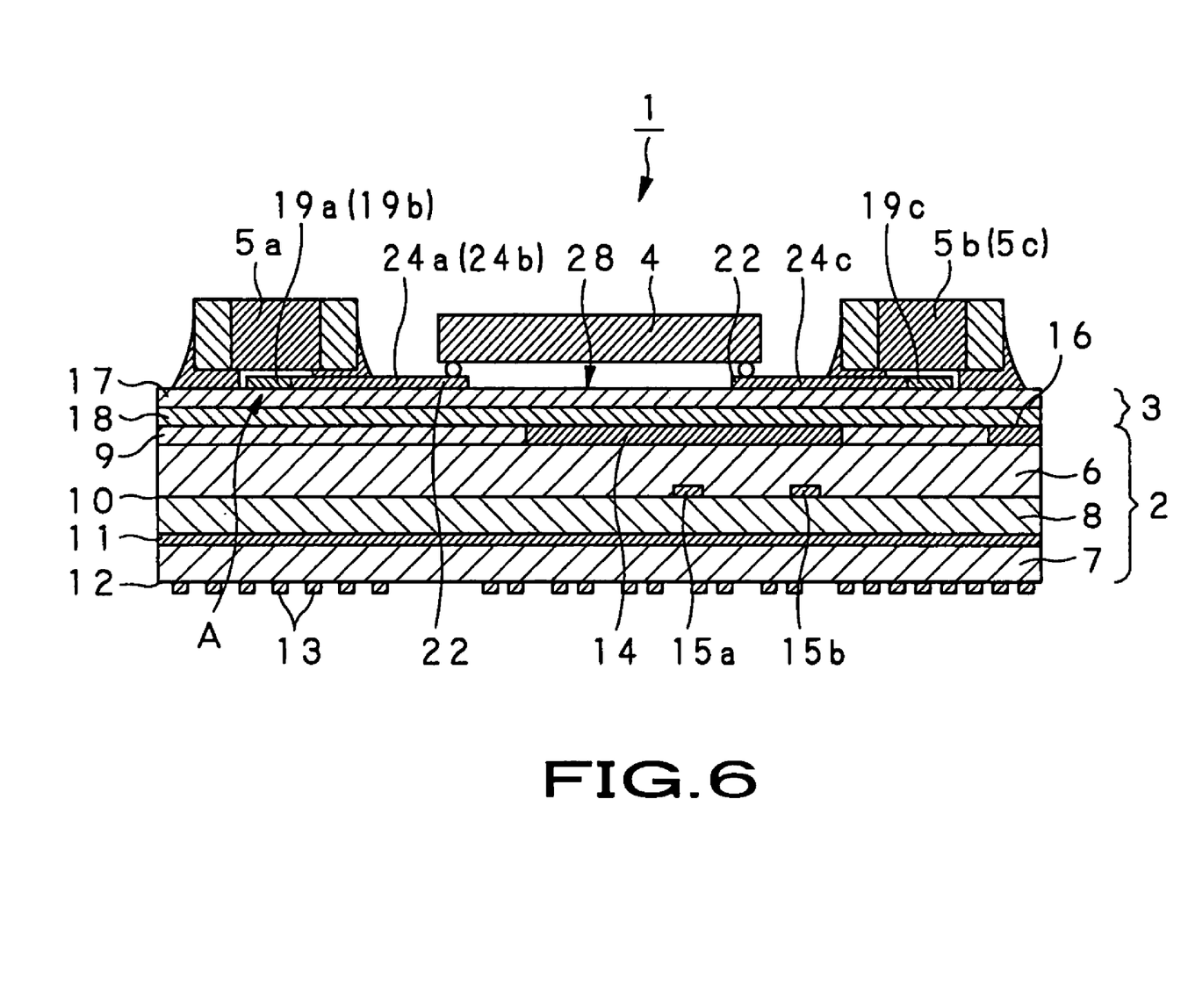
FIG. 6 shows a longitudinal sectional view of major part of a high frequency module according to the present invention.

FIG. 6 shows the configuration of a high frequency module 1 of the present invention which includes a base substrate unit 2, and a high frequency circuit unit 3 which is formed on the base substrate unit 2 in the lamination manner. The high frequency circuit unit 3 has mounted on the surface thereof a semiconductor chip 4 and plural surface-mount type electronic parts 5a, 5b, and 5c having peripheral circuit function of such as a high frequency transmission/reception circuit unit.

In the high frequency module 1, the base substrate unit 2 and the high frequency circuit unit 3 are electrically separated, which can suppress electrical interference toward the high frequency circuit unit 3 to realize property improvement. The high frequency module 1 has power circuits, control circuits, and digital signal processing circuits formed in the base substrate unit 2 thereof, and the base substrate unit 2 has mount portion to be mounted to an interposer or a motherboard, not shown, details of which will be omitted. In the high frequency module 1, since power circuits and ground patterns having sufficient area are formed in the base substrate unit 2, power supply under high regulation can be realized for the high frequency circuit unit 3.

The base substrate unit 2 has multilayered printed wiring boards of four layers and is formed by the general print circuit board technology, etc. The base substrate unit 2 has a pair of organic substrates 6 and 7, with their both surfaces copper-covered, unitedly put together with a prepreg 8 arranged therebetween. The first and second organic substrates 6, 7 have their copper foil treated under the photolithography processing and etching processing to form a third wiring layer 9, a fourth wiring layer 10 and a fifth wiring layer 11, a sixth wiring layer 12 on both surfaces thereof respectively. In the base substrate unit 2, the third wiring layer 9 and the sixth wiring layer 12 are connected through properly formed via holes.

On the other hand, the third, fourth, fifth, and sixth wiring layers 9, 10, 11, 12 of the base substrate unit 2 may be formed by employing other print circuit board technologies, and may be formed, for example, by patterning both surfaces of a pair of organic substrates using plating resist to form plated conductor under the additive method.

The base substrate unit 2 has the sixth wiring layer 12 coated with protective layer made of solder resist, etc., and has predetermined parts of thus formed protective layer treated under the photolithography processing to form openings. The base substrate unit 2 has its proper wiring pattern of the sixth wiring layer. 12 exposed to the respective openings Ni—Au electroless plated to form plural terminals 13. In the base substrate unit 2, these terminals 13 constitute connection terminals to mount the high frequency module 1 onto an interposer, etc., not shown.

In the base substrate unit 2, a ground pattern 14 is formed at part of the third wiring layer 9, and the fifth wiring layer 11 is a solid pattern ground layer whose whole surface leaves copper foil. In the base substrate unit 2, the fourth wiring layer 10, which is formed between the ground pattern 14 of the third wiring layer 9 and the solid pattern of the fifth wiring layer 11, has transmission lines 15*a* and 15*b* formed under the distributed parameter design formed therein. These transmission lines 15*a* and 15*b* which define the respective ground patterns formed in the upper and lower wiring layers as ground surfaces work as strip lines, operating as filter patterns or coupler patterns and so on.

In the base substrate unit 2, since the fourth wiring layer 10 is electrically shielded, it becomes possible to form signal processing circuits for digital signals in the fourth wiring layer 10, enabling manufacture of the high frequency module 1 of higher density. The base substrate unit 2, which has the ground pattern 14 formed partially therein, has no ground pattern which is defined as a ground surface for predetermined transmission lines formed in the high frequency circuit unit 3, details of which will be explained later. Thus, in the base substrate unit 2, thickness managing of respective insulating layers of the third, fourth, fifth, and sixth wiring layers 9, 10, 11, 12 with high accuracy is not necessary, that is, the respective insulating layers have their thickness retained at predetermined values, which can reduce affection toward high frequency property of the high frequency circuit unit 3 to be described later.

In the base substrate unit 2, the first organic substrate 6 and the second organic substrate 7 have organic base material of low relative dielectric constant property and low Tan δ property, that is, are superior in high frequency property and have mechanical stiffness, refractoriness, and chemical resistance. The first organic substrate 6 and the second organic substrate 7 are formed by uniting the organic base material having above-described property and glass woven fabric as core material in which glass fibers are woven reticulately, and then covering both surfaces of thus formed material with copper. As such organic base material, liquid crystal polymer (LCP), benzocyclobutene (BCB), polyimide, polynorbornene (PNB), polyphenylene ether (PPE), polytetrafluoroethylene (teflon: trademark), bismaleimide-triazine (BT-resin), or base material generated by scattering inorganic base material such as ceramic powder to such resin material is used.

In the base substrate unit 2, the third wiring layer 9 has an insulating resin layer formed thereon, and has the insulating resin layer including the surface of the wiring pattern planarized to form a buildup-forming surface 16 onto which the high frequency circuit unit 3 is formed in the lamination manner. In the planarization processing, the insulating resin layer is polished using scourer being mixture of alumina and silica to expose the wiring pattern of the third wiring layer 9. In forming the planarized buildup-forming surface 16 of the base substrate unit 2, the reactive ion etching processing (RIE) or plasma etching processing (PE) may be used other than above-described polish processing.

The base substrate unit 2 is not restricted to the four-layer configuration consisting of the third, fourth, fifth, and sixth wiring layers 9, 10, 11, 12, and may be of multilayer configuration having more than four layers. Using the first and second organic substrates 6, 7 of comparatively low price, the third, fourth, fifth, and sixth wiring layers 9, 10, 11, 12 are formed by the general print circuit board technology. Thus, the high frequency module 1 can be manufactured with comparatively high accuracy at low cost, enabling mass production.

Onto the planarized buildup-forming surface 16 of the base substrate unit 2, the high frequency circuit unit 3 is formed in the buildup manner with high accuracy by employing the thin-film technology or the thick-film technology. The high frequency circuit unit 3 is two-layer configuration consisting of a second wiring layer 18 formed on the buildup-forming surface 16 and a first wiring layer 17 formed on the second wiring layer 18. The first wiring layer 17 and the second wiring layer 18 are connected through properly formed via holes, not show, and are electrically connected to the base substrate unit 2.

The second wiring layer 18 consists of a dielectric insulating layer which is formed by, for example, coating the buildup-forming surface 16 with dielectric insulating material of predetermined thickness similar to the organic base material of the first and second organic substrates 6, 7 using the spin coat method or roll coat method, and a wiring pattern formed on the dielectric insulating layer. On the dielectric insulating layer, a metal thin film layer made of Al, Pt, or Au are formed on the whole surface thereof using the sputtering method, and then a conductor pattern is formed by forming a pattern on the metal thin film layer under the photolithography processing and removing unwanted part of the metal thin film layer under the etching processing. The second wiring layer 18 has passive elements such as capacitor elements, register elements, etc., and filter elements formed thereon.

The dielectric insulating layer has a tantalum nitride layer formed on the whole surface thereof in the film forming manner including the conductor pattern using the sputtering method. Part of the tantalum nitride layer is selectively left behind to form register elements in the second wiring layer 18, and is treated under the anodic oxidation processing to form the base of tantalum pentoxide which works as a dielectric film of capacitor elements. The tantalum nitride layer has formed thereon an anodic oxidation mask layer which has openings facing lower electrodes of capacitor elements or register elements forming part, and is treated under the anodic oxidation processing. The tantalum nitride layer has its part corresponding to the openings selectively treated under the anodic oxidation processing to form a tantalum pentoxide layer, and then has its unwanted part removed under the etching processing. Method of forming the capacitor elements and register elements is not restricted to above-described manner, and they may be formed in the pattern forming manner after forming a tantalum pentoxide layer by treating the whole surface of the tantalum nitride layer under the anodic oxidation processing.

As described above, since the second wiring layer 18 is formed on the planarized buildup-forming surface 16 of the base substrate unit 2, the dielectric insulating layer is formed with its thickness sufficiently managed and also respective passive elements are formed with high accuracy. On the other hand, method of forming the second wiring layer 18 is not restricted to above-described manner, and it may be formed by forming a metal thin film layer onto the whole surface of a dielectric insulating layer having patterned grooves corresponding to a wiring pattern formed thereon in advance using the sputtering method, and then polishing the metal thin film layer until the dielectric insulating layer is exposed. Thus, the second wiring layer 18 is formed with high accuracy in thickness as a whole, enabling planarization of the surface onto which the first wiring layer 17 is to be formed.

The first wiring layer 17 is the uppermost layer of the high frequency module 1, and has the semiconductor chip 4 and the electronic parts 5a, 5b, and 5c mounted thereon, as has been described above. The first wiring layer 17 consists of a dielectric insulating layer and a wiring pattern properly formed on the dielectric insulating layer, similar to the second wiring layer 18. The first wiring layer 17 is formed by forming a Cu layer which has small loss property in high frequency band on the dielectric insulating layer formed on the second wiring layer 18 using the sputtering method, and treating the Cu layer under the photolithography processing and the etching processing to form a predetermined wiring pattern.

The first wiring layer 17 has formed on the dielectric insulating layer thereof a first spiral type inductor element 19a, a second spiral type inductor element 19b, a third spiral type inductor element 19c, a first ground pattern 20 enclosing the first and second inductor element 19a, 19b, and a second ground pattern 21 enclosing the third inductor element 19c. The first wiring layer 17 has plural lands 22 for mounting a semiconductor chip to which respective terminals of the semiconductor chip 4 are to be directly connected under the flip chip mounting, and lands 23a, 23b, and 23c for mounting an electronic part to which the electronic parts 5a, 5b, and 5c are to be directly mounted.

The first wiring layer 17 has formed thereon a first transmission line 24a, a second transmission line 24b, and a third transmission line 24c to connect the first, second, and third inductor elements 19a, 19b, 19c to the semiconductor-chip-mount lands 22. Also, the first wiring layer 17 has formed thereon transmission lines 25a, 25b, and 25c to connect the semiconductor-chip-mount lands 22 to the electronic-part-mount lands 23a, 23b, and 23c. The first wiring layer 17 has formed thereon a high frequency signal transmission line 26 and a digital signal transmission line 27.

Furthermore, the first wiring layer 17 may have formed thereon passive elements such as capacitor elements, register elements, etc. and function elements such as antenna elements, filter elements, etc. in addition to the inductor elements 19 in the film forming manner. In this embodiment, the first wiring layer 17 has mounted thereon the semiconductor chip 4 which is connected to the ground. On the other hand, a semiconductor chip which does not need ground connection, similar to the electronic parts 5, may be mounted on the first wiring layer 17. The semiconductor chip 4 may be mounted on the first wiring layer 17 under not only the flip chip mounting but also other proper surface-mount technology. The first wiring layer 17 may have its inductor elements 19, transmission lines 24a, 24b, and 24c, and transmission lines 27 coated with protective layer made of solder resist, etc. except the lands 22 and 23, details of which will be omitted.

Figure 7:
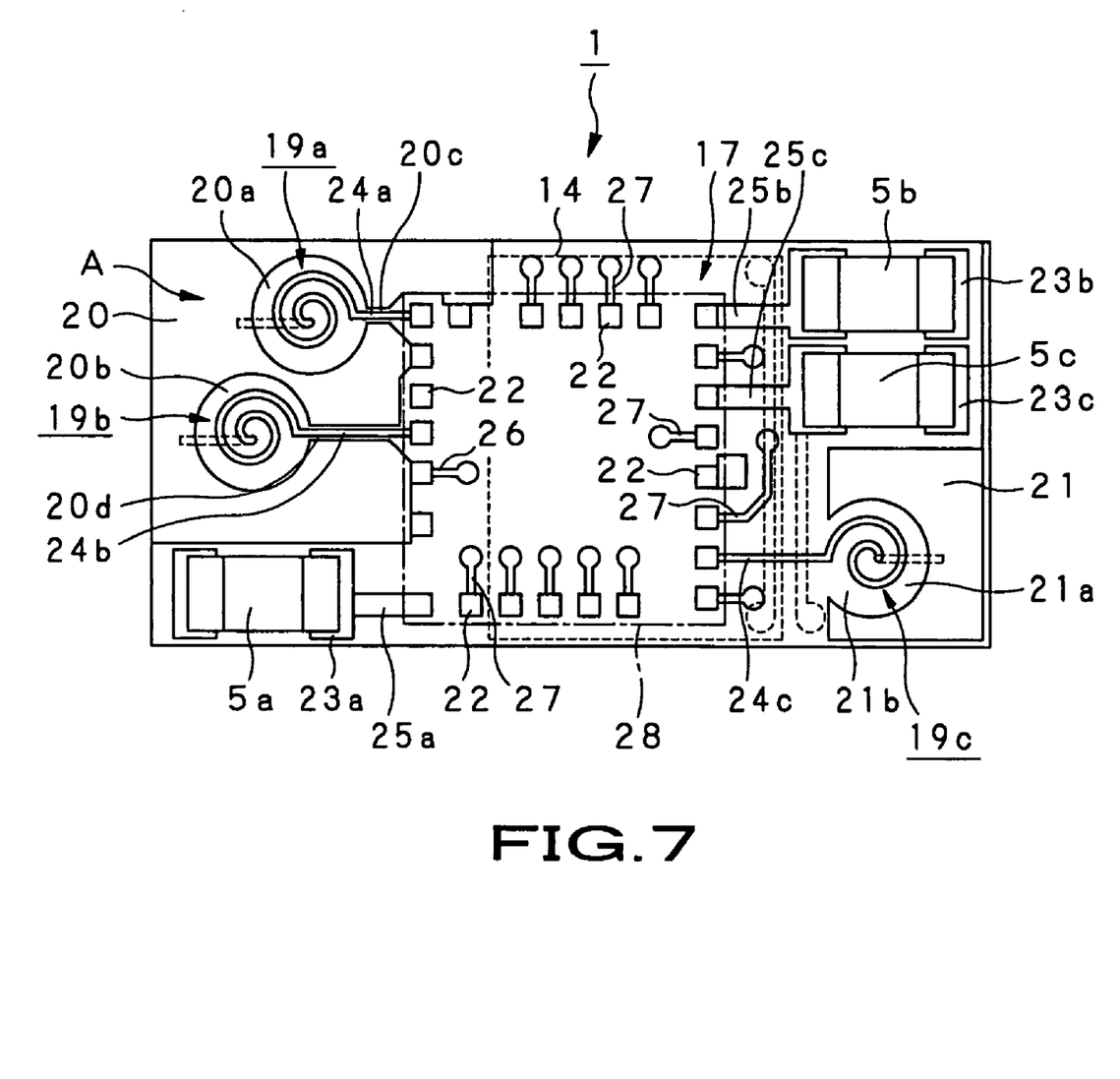
FIG. 7 shows a plan view of major part of a high frequency module according to the present invention.

As shown in FIG. 7, a rectangular region drawn in a chain line at substantially the center of the first wiring layer 17 is set to be a chip mounting region 28 onto which the semiconductor chip 4 is to be mounted, and the plural semiconductor-chip-mount lands 22 are arranged along four sides of the chip mounting region 28. The semiconductor-chip-mount lands 22 consist of lands 22a for inputting/outputting high frequency signals, lands 22b for inputting/outputting digital signals, and ground lands 22c, etc., details of which will be omitted. Some of the semiconductor-chip-mount lands 22 are connected to the inductor elements 19 and to the electronic parts 5 through the transmission lines 24, 25, and some of the semiconductor-chip-mount lands 22 are properly connected to the wiring pattern of the second wiring layer 18 through via holes.

The respective inductor elements 19 have their outer side ends connected to the transmission lines 24, and have their inner side ends properly connected to the wiring pattern 18a of the second wiring layer 18 through via holes, details of which will be omitted. The first inductor element 19a and the second inductor element 19b are enclosed by the first ground pattern 20 with circular insulation regions 20a and 20b arranged therebetween, as has been described hereinbefore. The first inductor element 19a and the second inductor element 19b are connected to the semiconductor-chip-mount lands 22 through the first transmission line 24a and the second transmission line 24b respectively which are insulated and directed within hollowed pattern regions 20c and 20d formed in the first ground pattern 20, details of which will be explained later.

The third inductor element 19c is enclosed by the second ground pattern 21 with a circular insulation region 21a arranged therebetween, as has been described hereinbefore. The third inductor element 19c is connected to the semiconductor-chip-mount lands 22 through the third transmission line 24c which is directed within a hollowed pattern region 21b formed in the second ground pattern 21.

Figure 8:
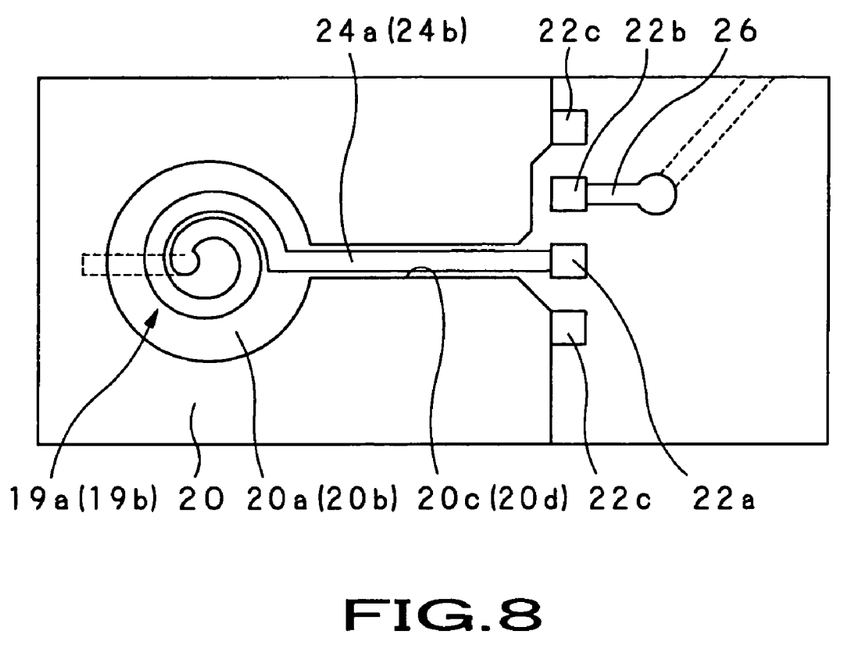
FIG. 8 shows a plan view of major part of a coplanar type transmission line formed on a wiring layer of the uppermost layer of a high frequency circuit unit.

The high frequency signal transmission line 26 has its one end connected to the inputting/outputting land 22b of the semiconductor-chip-mount lands 22, and has its other end directed to the inside of the chip mounting region 28 to be connected to the second wiring layer 18 or to the base substrate unit 2 through via holes, not shown, as show in FIG. 8. Also, the digital signal transmission line 27 has its one end connected to one of the semiconductor-chip-mount lands 22, and has its other end properly directed to the inside or to the outside of the chip mounting region 28 to be connected to the second wiring layer 18 or to the base substrate unit 2 through via holes, not shown.

In the high frequency circuit unit 3, part of the chip mounting region 28 corresponds to the ground pattern 14, drawn in a dotted line in FIG. 7, formed in the third wiring layer 9 of the base substrate unit 2 side. In the high frequency circuit unit 3, the third transmission line 24c of the third inductor element 19c and the transmission lines 25b, 25c of the second and third electronic parts 5b, 5c, which are formed at the right side of the first wiring layer 17 are so formed as to correspond to the ground pattern 14 of the base substrate unit 2 side, as shown in FIG. 7. Defining the ground pattern 14 as a ground surface, the respective transmission lines 24c, 25b, and 25c are configured as microstrip type transmission lines.

As described above, the high frequency circuit unit 3 has microstrip type transmission lines formed in part of the first wiring layer 17. In the high frequency circuit unit 3, being affected by the ground pattern 14, this region becomes disadvantageous in high frequency property as compared with the left side of the first wiring layer 17, which does not correspond to the ground pattern 14, shown as "A" in FIG. 7, details of which will be explained later. Thus, in the high frequency circuit unit 3, circuits including passive elements which do not require high frequency property of high accuracy are formed on this region corresponding to the ground pattern 14. Thus, the high frequency circuit unit 3 employing above-described configuration enables manufacture of the high frequency module 1 having a high frequency circuit block and a digital circuit block densely mounted therein. The high frequency circuit unit 3 can reduce the high frequency module 1 having a high frequency front-end circuit block and a baseband circuit block mounted therein in size by effectively utilizing the substrate area.

In the high frequency circuit unit 3, the left side of the first wiring layer 17 or the region "A" does not correspond to the ground pattern 14 of the base substrate unit 2 side, as shown in FIG. 6. Thus, in the high frequency circuit unit 3, being not affected by the ground pattern 14 of the base substrate unit 2, the left side region "A" becomes stable in high frequency property, which can improve operational property of the first inductor element 19*a* and the second inductor element 19*b* which are formed at the region "A". In the high frequency circuit unit 3, even though the region "A" corresponds to the ground pattern of the fifth wiring layer 11 of the base substrate unit 2 side, keeping a sufficient distance therebetween, the first inductor element 19*a* and the second inductor element 19*b* are not affected in high frequency property.

As described above, the high frequency circuit unit 3 has the first inductor element 19*a* and the second inductor element 19*b* as well we the first transmission line 24*a* and the second transmission line 24*b* formed thereon at the region "A". The first transmission line 24*a* and the second transmission line 24*b* have their one ends connected to the first inductor element 19*a* and the second inductor element 19*b*, respectively, as shown in FIG. 8. The first transmission line 24*a* and the second transmission line 24*b* are insulated and directed within the hollowed pattern regions 20*c* and 20*d* formed in the first ground pattern 20, and have their other ends connected to the lands 22*a* for inputting/outputting high frequency signals, respectively. Thus, being enclosed by a ground pattern at one common plane as well as not defining a ground surface in another corresponding layer, the first transmission line 24*a* and the second transmission line 24*b* are configured as coplanar type transmission lines.

In the high frequency circuit unit 3, as shown in FIG. 8, the ground lands 22*c*, to which ground terminals of the semiconductor chip 4 are connected, are formed unitedly with the first ground pattern 20. In the high frequency circuit unit 3, the first ground pattern 20 works as the ground for high frequency property of the semiconductor chip 4 as well as the guard ground of the first inductor element 19*a* and the second inductor element 19*b*. In the high frequency circuit unit 3, since the first ground pattern 20 is unitedly formed and ground terminals of the semiconductor chip 4 are directly connected to the ground lands 22*c* which are formed unitedly with the first ground pattern 20, it becomes possible to manufacture a high frequency module 1 of high accuracy having stable high frequency property which can retain high frequency connectivity and continuity between the semiconductor chip 4 and the first inductor element 19*a* or the second inductor element 19*b*.

In the high frequency module 1, a high frequency circuit unit is configured by the first inductor element 19*a*, second inductor element 19*b*, electronic part 5*a*, first ground pattern 20, high frequency signal transmission line 26, etc. Also, in the high frequency module 1, a digital circuit unit is configured by the electronic parts 5*b*, 5*c*, digital signal transmission line 27, etc. Furthermore, in the high frequency module 1, an analog low frequency circuit unit is configured by the third inductor element 19*c*, second ground pattern 21, etc. Thus, the high frequency module 1 has the high frequency circuit unit, digital circuit unit, and analog low frequency circuit unit jointly arranged therein.

The high frequency module 1 according to the present invention has the high frequency circuit unit 3 having passive elements such as inductor elements 19 and capacitor elements, filter elements, wiring patterns, etc. formed on the planarized buildup-forming surface 16 of the base substrate unit 2 in the lamination manner by employing the thin-film technology or the thick-film technology. Thus, in the high frequency module 1, film elements of high accuracy are formed in the high frequency circuit unit 3 as well as delicate wiring operation to form wiring patterns can be realized.

The high frequency module 1 according to the present invention has formed on the first wiring layer 17 of the high frequency circuit unit 3 the first transmission line 24*a* and the second transmission line 24*b* to connect the semiconductor-chip-mount lands 22, to which terminals of the semiconductor chip 4 are connected, and the inductor elements 19. In the high frequency module 1, the first ground pattern 20 which works as the guard ground of the inductor elements 19 and the ground lands 22*c* to which terminals of the semiconductor chip 4 are connected, which are formed on the first wiring layer 17 of the high frequency circuit unit 3, are unitedly formed. In the high frequency module 1, the semiconductor chip 4 and the inductor elements 19 become of high accuracy and have stable high frequency property, retaining high frequency connectivity and continuity sufficiently.

In the high frequency module 1, being directed within the hollowed pattern regions 20*c* and 20*d* formed in the first ground pattern 20, the first transmission line 24*a* and the second transmission line 24*b* are enclosed by a ground pattern at one common plane. In the high frequency module 1, the first transmission line 24*a* and the second transmission line 24*b* are configured as coplanar type transmission lines which are not required to define a ground surface at the lower layer side. In the high frequency module 1, since a ground pattern is not necessary in inner layers of the base substrate unit 2 and the high frequency circuit unit 3, the high frequency circuit unit 3 has formed on the uppermost layer thereof the first wiring layer 17 with a dielectric insulating layer arranged therebetween. The high frequency module 1 has high frequency property of high accuracy and of favorable state, being not required to manage thickness of respective insulating layers with high accuracy.

In the high frequency module 1, coplanar type transmission lines and microstrip type transmission lines or ground coplanar type transmission lines are formed at the high frequency circuit unit 3 side as well as strip type transmission lines are formed at the base substrate unit 2 side by forming the ground pattern 14 at part of the base substrate unit 2. On the other hand, the present invention is not restricted to this case, and coplanar type transmission lines alone may be formed at the high frequency circuit unit 3 side of the high frequency module 1.

In the high frequency module 1, the ground pattern 14 may be formed into a solid pattern to form a hollowed pattern at part thereof facing a necessary region of the high frequency circuit unit 3 so as to form the first transmission line 24*a* and the second transmission line 24*b* facing the hollowed pattern region and the pattern region. In the high frequency module 1, the first transmission line 24*a* and the second transmission line 24*b*, which face the ground pattern 14, define the ground pattern 14 as a ground surface to constitute ground coplanar type transmission lines. In the high frequency module 1, other transmission lines as well as coplanar type transmission lines may be jointly formed in the first wiring layer 17 to partially form a high frequency property region of high accuracy; responding to demands if necessary.

The present invention is not limited to above-described preferred embodiment, and it should be understood by those ordinarily skilled in the art that various modifications, alternative constructions or equivalents can be implemented without departing from the scope and spirit of the present invention.

INDUSTRIAL APPLICABILITY

As in the above, according to the high frequency module of the present invention, since a high frequency circuit unit is formed on a planarized buildup-forming surface of a base substrate unit in the lamination manner, film elements such as passive elements and function elements may be formed in wiring parts of the high frequency circuit unit with high accuracy.

Furthermore, according to the high frequency module of the present invention, since coplanar type transmission lines, which are required to define no ground surface at wiring layers of lower layers and are enclosed by a ground pattern to be directed, are formed on the uppermost wiring layer of a high frequency circuit unit, inequality in thickness of insulating layers of respective wiring layers can be reduced and affection of the ground pattern is removed, as well as severance of ground patterns formed on the uppermost wiring layer can be prevented, which can retain high frequency connectivity and continuity between film elements and lands, and can improve high frequency property.

The invention claimed is:

1. A high frequency module, comprising:
    a plurality of wiring layers and an uppermost layer planarized to form a buildup-forming surface;
    wherein the wiring layers include a wiring pattern and film elements formed on a dielectric insulating layer thereof, and the uppermost wiring layer has plural lands and ground patterns formed thereon together with the wiring pattern and film elements; and
    components consisting of a semiconductor chip and electronic parts mounted on the uppermost wiring layer and ground terminals connected to ground patterns;
    wherein transmission lines are formed on the uppermost wiring layer adjacent a ground pattern to constitute coplanar type transmission lines and further wherein lower layers directly beneath the transmission lines do not include ground planes in the regions perpendicularly below the transmission lines.

2. The high frequency module as set forth in claim 1, wherein second transmission lines constituting microstrip type transmission lines or ground coplanar type transmission lines are formed at the wiring layers of the high frequency circuit unit which define a ground pattern formed at part of the wiring layers of the base substrate unit as a ground surface, and
    third transmission lines constituting strip type transmission lines are formed at the wiring layers of the base substrate unit which are arranged between ground patterns formed at upper and lower layers.

3. A high frequency module, comprising:
    a plurality of wiring layers, wherein at least one of the layers includes a portion defining a ground plane, and wherein another wiring layer has a high frequency region including at least one transmission line formed as a conductive pattern having ground patterns adjacent thereto formed in the same wiring layer as the transmission line, wherein a ground plane for any layer of the high frequency module near the high frequency region does not extend into the region perpendicularly beneath the transmission line.

4. A high frequency module, comprising:
    a plurality of wiring layers, wherein at least one of the layers includes a portion defining a ground plane, and wherein another wiring layer has a high frequency region including at least one transmission line formed as a conductive pattern having ground patterns adjacent thereto formed in the same wiring layer as the transmission line, the wiring layer having a high frequency region further including at least one inductor having a ground pattern adjacent thereto formed in the same wiring layer, and further wherein a ground plane for any layer of the high frequency module near the high frequency region does not extend into the region perpendicularly beneath the transmission line or the inductor.

* * * * *